United States Patent
Xin-LeBlanc

(10) Patent No.: US 7,061,277 B1
(45) Date of Patent: Jun. 13, 2006

(54) LOW POWER DIFFERENTIAL-TO-SINGLE-ENDED CONVERTER WITH GOOD DUTY CYCLE PERFORMANCE

(75) Inventor: Jane Xin-LeBlanc, Santa Clara, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 10/972,744

(22) Filed: Oct. 25, 2004

Related U.S. Application Data

(63) Continuation of application No. 10/630,153, filed on Jul. 30, 2003, now Pat. No. 6,809,566.

(51) Int. Cl.
*H03K 9/08* (2006.01)
(52) U.S. Cl. .......................................... 327/37; 327/40
(58) Field of Classification Search .................. 327/37, 327/40, 41, 47, 63, 65, 147, 156; 330/252; 331/17, 25; 375/373, 375, 376
See application file for complete search history.

(56) References Cited

U.S. PATENT DOCUMENTS

| | | | |
|---|---|---|---|
| 5,880,615 A | 3/1999 | Bazes | 327/307 |
| 6,426,662 B1 | 7/2002 | Arcus | 327/295 |
| 6,933,752 B1 * | 8/2005 | Dreps et al. | 327/65 |

* cited by examiner

*Primary Examiner*—Linh My Nguyen

(57) ABSTRACT

A differential-to-single-ended (DSE) converter receives a positive differential input and a negative differential input and generates a single-ended output. The DSE converter comprises: 1) a first comparator having a non-inverting input coupled to the positive differential input and an inverting input coupled to the negative differential input; 2) a second comparator having an inverting input coupled to the positive differential input and a non-inverting input coupled to the negative differential input; 3) a first D flip-flop having a Logic 1 input and clocked by a rising edge on the first comparator output; 4) a second D flip-flop having a Logic 1 input and clocked by a rising edge on the second comparator output; and 5) a latch circuit having a first input coupled to the first D flip-flop output and a second input coupled to the second D flip-flop output. Rising edges on the first and second D flip-flop outputs cause the latch output to change state.

20 Claims, 3 Drawing Sheets

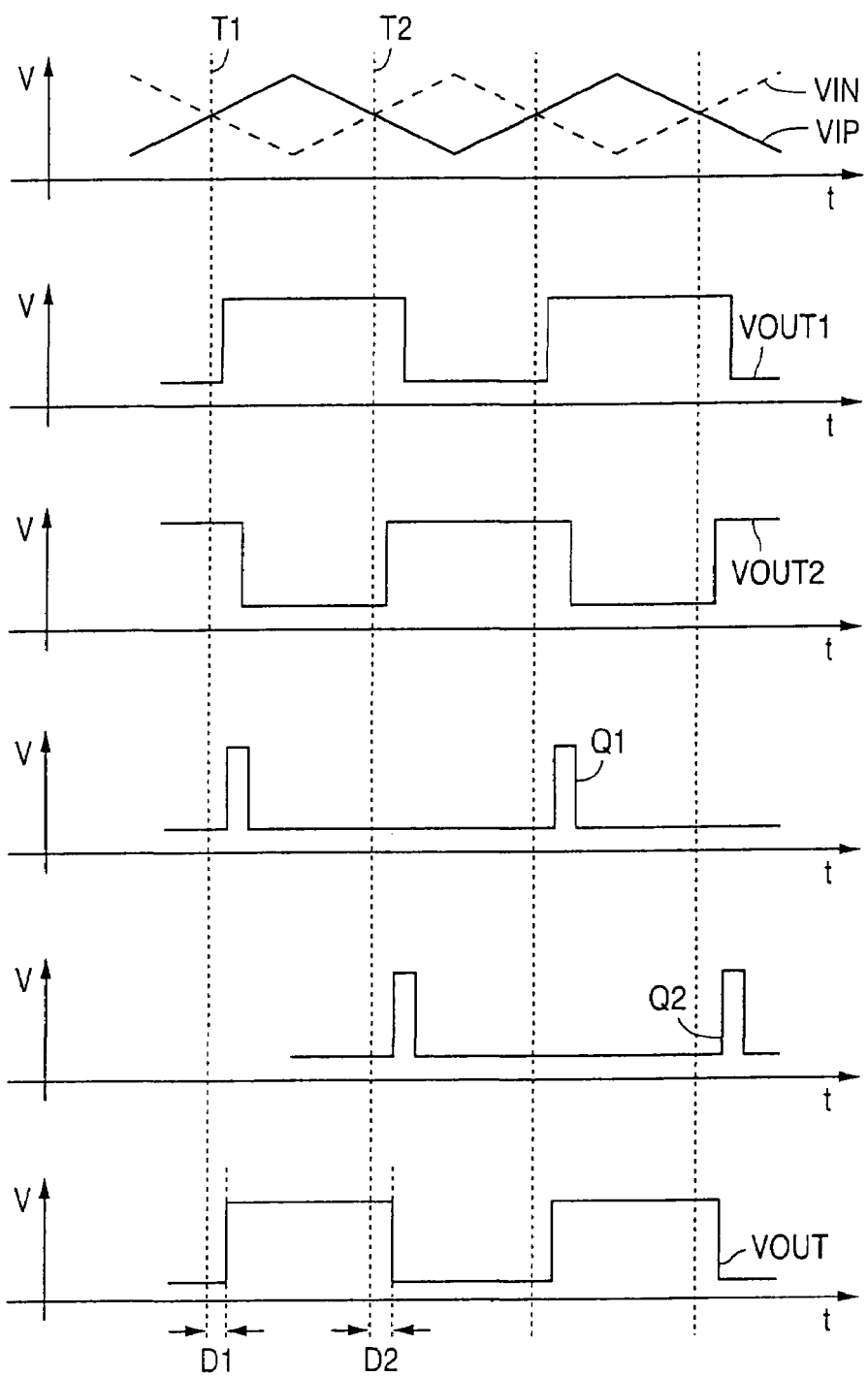

LOW POWER DIFFERENTIAL-TO-SINGLE-ENDED CONVERTER WITH GOOD DUTY CYCLE PERFORMANCE

This application is a continuation of prior U.S. patent application Ser. No. 10/630,153 filed on Jul. 30, 2003, now U.S. Pat. No. 6,809,566.

TECHNICAL FIELD OF THE INVENTION

The present invention is generally directed to differential-to-single-ended (DSE) converters and, in particular, to a DSE converter that minimizes power consumption and provides an accurate 50% duty cycle.

BACKGROUND OF THE INVENTION

In many conventional phase-locked loop (PLL) designs, the voltage-controlled oscillator (VCO) is implemented as a plurality of ring oscillator stages that produce fully differential output signals having output voltage ranges that are smaller than the range of the power supplies. However, if the fully differential outputs are used as digital clock signals, they generally must be converted to single-ended rail-to-rail outputs. These designs therefore require a differential-to-single-ended (DSE) converter to produce the required single-ended output clock signal.

Because a good duty cycle is often desired in a system clock, a DSE converter must produce an output that is as close to a 50% duty cycle as possible. One well-known conventional apparatus for performing DSE conversion uses a comparator with a differential input stage. However, an imperfect duty cycle is caused by the mismatch of the rise time and fall time of such a comparator. Various techniques have been employed to minimize such a mismatch, but because of the single-ended nature of the output, there will always be some systematic mismatch between rise time and the fall time. Another way to further improve the matching is to make the comparator fast—if both the rise time and the fall time are small, the mismatch between the two also is small. Unfortunately, this approach leads to high power consumption.

A DSE converter also may consume high power due to the operation of the phase-locked loop (PLL). During frequency acquisition, the voltage-controlled oscillator (VCO) may oscillate at frequencies above the final target. In cases where the initial loop filter voltage happens to be at a maximum (i.e., the positive power supply), the VCO can oscillate at frequencies far above the final lock target. In order for the PLL to lock successfully, the DSE converter must be able to operate properly not just at the target VCO frequency, but also at the maximum frequency the VCO can produce during acquisition. As a result the DSE converter is designed for high-frequency operation and consumes more power than necessary. In a low power PLL design, such as that used in a battery-powered device, the power consumption of the DSE converter may be a significant portion of the total power consumption.

Therefore, there is a need in the art for an improved differential-to-single-ended (DSE) converter that maintains a very accurate 50% duty cycle in a phase-locked loop (PLL) design. In particular, there is need for a DSE converter that operates at relatively low power and relatively high frequency while maintaining a very accurate 50% duty cycle.

SUMMARY OF THE INVENTION

The present invention provides a differential-to-single-ended (DSE) converter with good duty-cycle performance that uses two simple comparators and some logic circuits, wherein a differential ring oscillator generates the input signals. Low power consumption can be achieved by employing: 1) a circuit topology that is insensitive to mismatches of comparator rise and fall delays; and 2) a dynamic bias current.

To address the above-discussed deficiencies of the prior art, it is a primary object of the present invention to provide a differential-to-single-ended (DSE) converter that receives a positive differential input signal and a negative differential input signal and generates a single-ended output signal. The DSE converter comprises: 1) a first comparator having a non-inverting input coupled to the positive differential input signal and an inverting input coupled to the negative differential input signal; 2) a second comparator having an inverting input coupled to the positive differential input signal and a non-inverting input coupled to the negative differential input signal; 3) a first D flip-flop having an input connected to Logic 1 and clocked by a rising edge on an output of the first comparator; 4) a second D flip-flop having an input connected to Logic 1 and clocked by a rising edge on an output of the second comparator; and 5) a latch circuit having a first input coupled to an output of the first D flip-flop and a second input coupled to an output of the second D flip-flop, wherein a rising edge on an output of the first D flip-flop causes an output of the latch to change state and a rising edge on an output of the second D flip-flop causes the latch output to change state.

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation. A controller may be implemented in hardware, firmware or software, or some combination of at least two of the same. It should be noted that the functionality associated with a controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present invention and its advantages, reference is now made to the following description taken in conjunction with the accompanying drawings, in which like reference numerals represent like parts:

FIGS. 4A–4F depict selected waveforms that explain the operation of the exemplary differential-to-single-ended converter according to the principles of the present invention.

DETAILED DESCRIPTION OF THE INVENTION

FIGS. 1 through 4, discussed below, and the various embodiments used to describe the principles of the present invention in this patent document are by way of illustration only and should not be construed in any way to limit the scope of the invention. Those skilled in the art will understand that the principles of the present invention may be implemented in any suitably arranged differential-to-single-ended converter.

Figure 1:
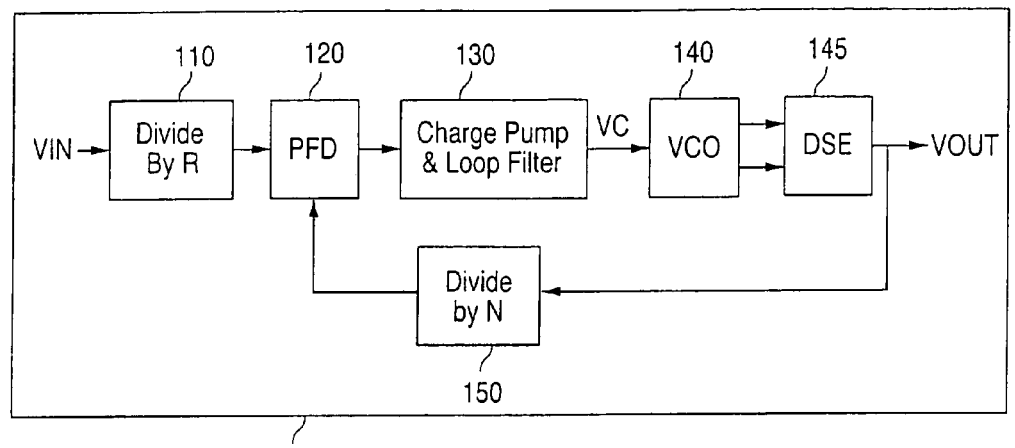
FIG. 1 illustrates an exemplary phase-locked loop (PLL) that incorporates a differential-to-single-ended converter according to the principles of the present invention.

FIG. 1 illustrates exemplary phase-locked loop (PLL) 100, which incorporates a differential-to-single-ended converter according to the principles of the present invention. PLL 100 comprises frequency divider 110, phase-frequency detector (PFD) 120, charge pump and loop filter circuit 130, voltage-controlled oscillator (VCO) 140, differential-to-single-ended (DSE) converter 145, and frequency divider 160. Frequency divider 110 divides the frequency of the input signal, VIN, by R, where R may be an integer of a fractional value. Frequency divider 150 divides the frequency of the output signal, VOUT, by N, where N may be an integer or a fractional value.

PFD 120 receives and compares the frequency-divided reference signal from frequency divider 110 and the frequency-divided feedback signal from frequency divider 150. Depending on whether the frequency of the feedback signal is greater than or less than the frequency of the reference signal, PFD 130 generates either a Pump Up signal or a Pump Down signal that is applied to charge pump and loop filter 130. If a Pump Up signal is received, charge pump and loop filter 130 adds charge to the loop filter, which is typically a large storage capacitor. If a Pump Down signal is received, charge pump and loop filter 130 discharges the loop filter. The voltage on the loop filter is the control voltage, VC, at the output of charge pump and loop filter 130.

Voltage-controlled oscillator (VCO) 140 produces a differential output signal, which DSE converter 145 converts to the single ended output signal, VOUT. The output of VCO 140 has a frequency that is controlled by the control voltage, VC. As the VC voltage increases, the frequency of the VCO 140 output signal increases (as does the VOUT signal). As the VC voltage decreases, the frequency of the VCO 140 output signal decreases (as does the VOUT signal). Thus, through the operation of the negative feedback path in PLL 150, the frequency of the VOUT output signal is held at some multiple of the frequency of the VIN input signal, where the multiple is determined by the values of R and N of frequency dividers 110 and 150, respectively.

Figure 2:
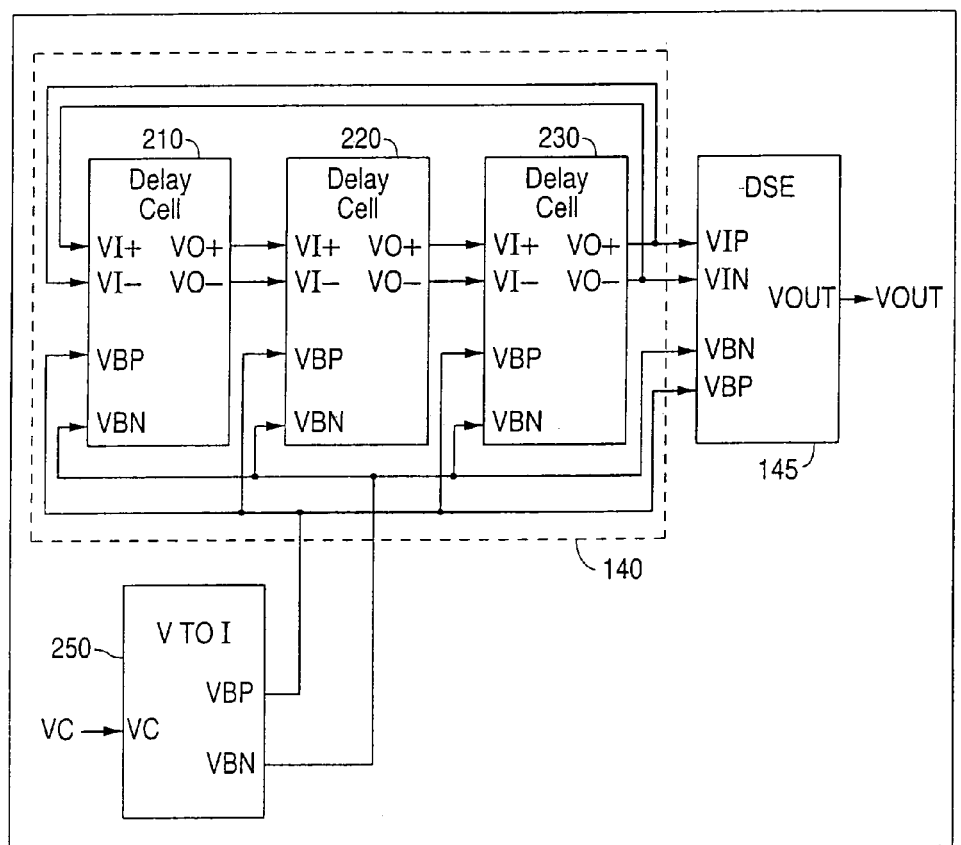
FIG. 2 illustrates selected portions of the phase-locked loop (PLL) in greater detail according to one embodiment of the present invention.

FIG. 2 illustrates selected portions of phase-locked loop (PLL) 100 according to one embodiment of the present invention. VCO 140 and DSE 145 are shown in greater detail. VCO 140 is a well-known conventional design comprising a ring oscillator containing delay cells 210, 220 and 230, and voltage-to-current (V-to-I) bias controller 250. Each delay cell receives a differential input signal, VI+ and VI−, and generates a differential output signal, VO+ and VO−. The delay time through each cell is controlled by the bias currents controlled by the signals VBP and VBN generated by V-to-I bias controller 250.

V-to-I bias controller 250 converts the input voltage, VC, to a proportional current. In this case, the outputs of V-to-I bias controller 250 are bias voltages VBP and VBN. The VBP and VBN bias voltages control the ring oscillator and DSE converter 145 and enable those circuits to reproduce the proportional current. The VBP control signal controls the current in the P-channel devices in the ring oscillator and DSE converter 145. The VBN control signal controls the current in the N-channel devices in the ring oscillator and DSE converter 145.

It is noted that the bias currents in DSE converter 145 track the bias currents in VCO 140. Thus, when the oscillation frequency of VCO 140 is high, DSE converter 145 receives higher bias currents as well, thereby enabling DSE converter 145 to function at a higher frequency. This dynamic biasing enables DSE converter 145 to keep up with the oscillation frequency of VCO 140 during PLL acquisition, without having to consume an excess amount of power after the PLL is locked.

Figure 3:
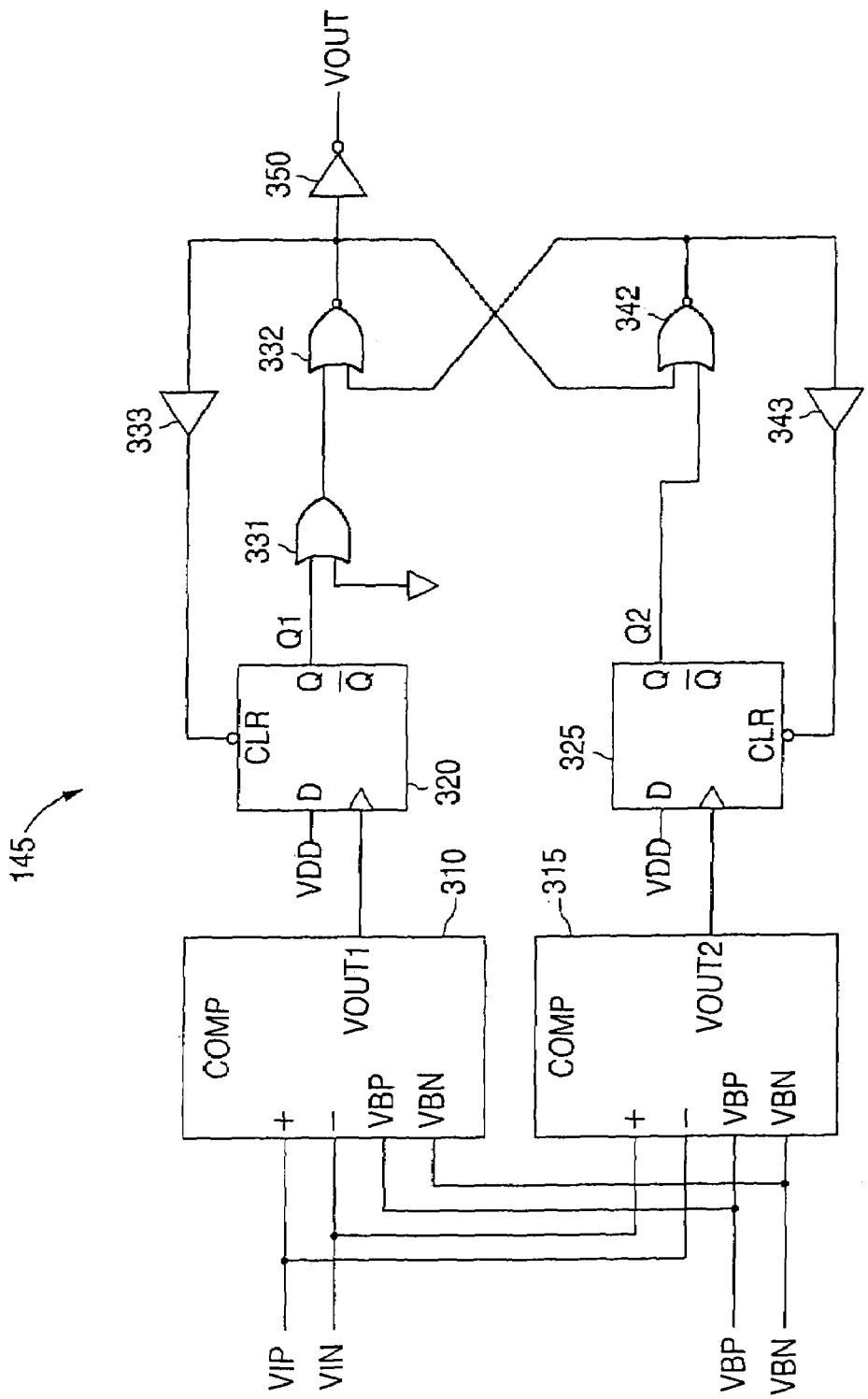
FIG. 3 illustrates the differential-to-single-ended (DSE) converter in greater detail according to one embodiment of the present invention.

FIG. 3 illustrates differential-to-single-ended (DSE) converter 145 in greater detail according to one embodiment of the present invention. DSE converter 145 comprises comparators 310 and 315, D-type flip-flops 320 and 325, OR gate 331, NOR gates 332 and 342, buffers 333 and 343, and inverter 350. Comparators 310 and 315 are identical. D-type flip-flops 320 and 325 also are identical. Both have asynchronous resets and both have D inputs connected to Logic 1 values. NOR gates 332 and 342 form a latch. OR gate 331 and buffers 333 and 343 provide the latch with delay and buffering.

The differential outputs of the ring oscillator (i.e., VO+ and VO−outputs of delay cell 230) are the positive (VIP) and negative (VIN) differential inputs to DSE converter 145. The VIP input of DSE converter 145 is coupled to the non-inverting or positive (+) input of comparator 310 and to the inverting or negative (−) input of comparator 315. Similarly, the VIN input of DSE converter 145 is coupled to the inverting or negative (−) input of comparator 310 and to the non-inverting or positive (+) input of comparator 315. Thus, the outputs of comparators 310 and 315 are always in opposite phase to each other.

FIGS. 4A–4F depict selected waveforms that explain the operation of exemplary differential-to-single-ended (DSE) converter 145 according to one embodiment of the present invention. FIG. 4A illustrates the VIP input signal (solid line) and the VIN input signal (dotted line). FIG. 4B illustrates the VOUT1 output signal of comparator 310. FIG. 4C illustrates the VOUT2 output signal of comparator 315. FIG. 4D illustrates the Q1 output signal of D-type flip-flop 320. FIG. 4E illustrates the Q2 output signal of D-type flip-flop 325. Finally, FIG. 4F illustrates the VOUT signal from DSE converter 145.

When the VIP input becomes greater than the VIN input, the VOUT1 output of comparator 310 switches from Logic 0 to Logic 1 and the VOUT2 output of comparator 315 switches from Logic 1 to Logic 0. On the rising edge of the VOUT1 signal at time T1, D-type flip-flop 320, OR gate 331, NOR gate 332 and buffer 333 combine to generate a one-shot (i.e., a narrow pulse) at the Q1 output of D-type flip-flop 320. The latch formed by NOR gates 332 and 342 drives the output VOUT to Logic 1.

When the VIP input becomes less than the VIN input, the VOUT1 output of comparator 310 switches from Logic 1 to Logic 0 and the VOUT2 output of comparator 315 switches from Logic 0 to Logic 1. At this rising edge of the VOUT2 signal at time T2, D-type flip-flop 325, NOR gate 342 and buffer 343 combine to generate a one-shot (i.e., a narrow pulse) at the Q2 output of D-type flip-flop 325. The latch formed by NOR gates 332 and 342 drives the output VOUT to Logic 0. It is noted that the NOR gate latch is incorporated into the two one-shot loops. This guarantees that the one-shot pulse widths are always sufficiently wide to drive the output to the desired logic states.

Because the differential ring oscillator formed by delay cells 210, 220 and 230 generates a perfect 50% duty cycle on the differential outputs of delay cell 230, the goal of DSE converter 145 is to preserve this 50% duty cycle. The circuit in FIG. 3 does exactly that. The present invention is designed such that the delay, D1, from the T1 cross point (where VIP>VIN) to the rising edge of VOUT is the same as the delay, D2, from the T2 cross point (where VIN>VIP) to the falling edge of VOUT. The D1 and D2 delays are shown in FIG. 4F.

Tracing through the circuit in FIG. 3, the D1 and D2 delays can be derived as follows:

$$D1=D310\_L2H+D320\_Q1+D331\_L2H+D332\_H2L+D350\_L2H; \quad [\text{Eqn. 1}]$$

$$D2=D315\_L2H+D325\_Q2+D342\_H2L+D332\_L2H+D350\_H2L. \quad [\text{Eqn. 2}]$$

In Equations 1 and 2, D310_L2H is the delay time for comparator 310 output to make a transition from logic low to logic high (i.e., rise time delay), D320_Q1 is the gate delay from flip-flop 320 clock input to the Q1 output, D331_L2H is the gate delay for OR gate 331 output to make a transition from logic low to logic high, and so forth.

Because comparators 310 and 315 identical, flip-flops 320 and 325 are identical, and NOR gates 332 and 342 are identical, the following are true:

D310_L2H=D315_L2H;
D320_Q1=D325_Q2; and
D332_H2L=D342_H2L.

In order to make D1=D2, the following must be made true:

$$D331\_L2H+D350\_L2H=D332\_L2H+D350\_H2L. \quad [\text{Eqn. 3}]$$

Because OR gate 331 and NOR gate 332 are similar gates, and in most modern processes the delay of these simple logic gates are relatively small, Equation 3 can be satisfied to a high degree by either custom designing the gates or accepting whatever small mismatch standard cells give.

It is noted that in Equations 1 and 2, the D1 and D2 delays rely only on the comparator rise time delays. Therefore, there is no need to make the comparator rise delay match the comparator fall time delay in order to achieve good duty cycle. This permits the use of relatively slow comparators, thereby keeping power consumption low.

Although the present invention has been described with an exemplary embodiment, various changes and modifications may be suggested to one skilled in the art. It is intended that the present invention encompass such changes and modifications as fall within the scope of the appended claims.

What is claimed is:

1. A differential-to-single ended (DSE) converter apparatus, comprising:
   a first comparator having a non-inverting input which receives a positive component of a differential input signal and having an inverting input which receives a negative component of said differential input signal;
   a second comparator having an inverting input which receives said positive component of said differential input signal and having a non-inverting input which receives said negative component of said differential input signal;
   a control signal generator having an input coupled to said first and second comparators, said control signal generator generating a control signal in response to operation of said first and second comparators; and
   a latch having an input coupled to said control signal generator and having an output, said latch responsive to said control signal for toggling an output signal at said output thereof.

2. The apparatus of claim 1, wherein said latch and said signal generator share a logic gate in common.

3. The apparatus of claim 1, wherein said control signal includes first and second control pulse signals.

4. The apparatus of claim 3, wherein said control signal generator produces said first and second control pulse signals respectively on first and second nodes thereof.

5. The apparatus of claim 3, wherein said first and second control pulse signals are temporally separated from one another.

6. The apparatus of claim 5, wherein said control signal generator produces said first and second control pulse signals respectively on first and second nodes.

7. The apparatus of claim 1, wherein said control signal generator includes a one-shot circuit.

8. The apparatus of claim 7, wherein said latch includes first and second logic gates, each of said logic gates having an output that is connected to an input of the other of said logic gates.

9. The apparatus of claim 8, wherein said one-shot circuit includes said first logic gate.

10. The apparatus of claim 9, wherein said control signal generator includes a further one-shot circuit, said further one-shot circuit including said second logic gate.

11. The apparatus of claim 7, wherein said one-shot circuit includes a D flip-flop.

12. A phase-locked loop (PLL) circuit, comprising:
   a loop filter for generating a control voltage;
   a voltage controlled oscillator having an input and a differential output and including:
      a bias controller coupled to said input, said bias controller producing a bias control signal in response to the control voltage at said input; and
      an oscillator circuit coupled to said bias controller and said differential output, said oscillator circuit producing bias current in response to said bias control signal, said oscillator circuit using said bias current to produce a differential output signal at said differential output; and
   a differential-to-single ended (DSE) converter coupled to said differential output and said bias controller, said DSE converter producing further bias current in response to said bias control signal so that said further bias current tracks said bias current produced by said oscillator circuit, said DSE converter using said further bias current to convert said differential output signal into a single-ended signal.

13. The circuit of claim 12, wherein said bias control signal includes a pair of voltage signals.

14. The circuit of claim 13, wherein said further bias current in said DSE converter and said bias current in said oscillator circuit each include a pair of bias currents that respectively correspond to said pair of voltage signals.

15. The circuit of claim 12, wherein said oscillator circuit uses said bias current to control a signal propagation delay therein.

16. A phase-locked loop (PLL) circuit, comprising:
a voltage controlled oscillator having an input and a differential output and including:
  a bias controller coupled to said input said bias controller producing a bias control signal in response to a control voltage at said input; and
  an oscillator circuit coupled to said bias controller and said differential output, said oscillator circuit producing bias current in response to said bias control signal, said oscillator circuit using said bias current to produce a differential output signal at said differential output; and
a differential-to-single ended (DSE) converter coupled to said differential output and said bias controller, said DSE converter producing further bias current in response to said bias control signal so that said further bias current tracks said bias current produced by said oscillator circuit, said DSE converter using said further bias current to convert said differential output signal into a single-ended signal;
wherein said DSE converter includes:
  a first comparator having a non-inverting input which receives a positive component of said differential output signal and having an inverting input which receives a negative component of said differential output signal;
  a second comparator having an inverting input which receives said positive component of said differential output signal and having a non-inverting input which receives said negative component of said differential output signal;
  a control signal generator having an input coupled to said first and second comparators, said control signal generator generating a control signal in response to operation of said first and second comparators; and
  a latch having an input coupled to said control signal generator and having an output that provides said single-ended signal, said latch responsive to said control signal for toggling said single-ended signal at said output thereof.

17. A phase-locked loop (PLL) circuit, comprising:
a voltage-controlled oscillator which produces, in response to a control voltage, a differential signal having a frequency controlled by said control voltage; and
a differential-to-single ended (DSE) converter coupled to said voltage-controlled oscillator, including:
  a first comparator having a non-inverting input which receives a positive component of said differential signal and having an inverting input which receives a negative component of said differential signal;
  a second comparator having an inverting input which receives said positive component of said differential signal and having a non-inverting input which receives said negative component of said differential signal;
  a control signal generator having an input coupled to said first and second comparators, said control signal generator generating a control signal in response to operation of said first and second comparators; and
  a latch having an input coupled to said control signal generator and having an output, said latch responsive to said control signal for toggling an output signal at said output thereof.

18. The circuit of claim 17, wherein said latch and said signal generator share a logic gate in common.

19. The circuit of claim 17, wherein said control signal generator includes a one-shot circuit.

20. The circuit of claim 17, wherein said control signal generator produces said control signal as first and second temporally separated control pulse signals on respective first and second nodes of said control signal generator.

* * * * *